_US005229971A_

United States Patent [19]

Kiryu et al.

[11] Patent Number: 5,229,971
[45] Date of Patent: Jul. 20, 1993

[54] SEMICONDUCTOR MEMORY DEVICE

[75] Inventors: Masakazu Kiryu; Shigeo Ohshima, both of Yokohama, Japan

[73] Assignee: Kabushiki Kaisha Toshiba, Kawasaki, Japan

[21] Appl. No.: 613,001

[22] Filed: Nov. 15, 1990

[30] Foreign Application Priority Data

Nov. 15, 1989 [JP] Japan ................................. 1-296464

[51] Int. Cl.$^5$ ............................ G11C 7/00; G11C 8/00
[52] U.S. Cl. ........................... 365/230.03; 365/189.01; 365/189.05
[58] Field of Search ................. 365/189.05, 230.03, 365/189.01

[56] References Cited

U.S. PATENT DOCUMENTS

| | | | |
|---|---|---|---|
| 4,807,189 | 2/1989 | Pinkham et al. .................. | 365/189 |
| 4,855,957 | 8/1989 | Nogami ............................. | 365/230.03 |
| 4,899,310 | 2/1990 | Baba et al. ........................ | 365/189.05 |
| 4,926,385 | 5/1990 | Fujishima et al. ................ | 365/230.03 |
| 5,051,954 | 9/1991 | Toda et al. ....................... | 365/230.03 X |
| 5,111,386 | 5/1992 | Fujishima et al. ................ | 365/189.05 X |

FOREIGN PATENT DOCUMENTS 0214705 3/1987 European Pat. Off. .
0352572 1/1990 European Pat. Off. .

OTHER PUBLICATIONS

Jeff Mailloux et al., "Speed Memory, Ease Timing Requirements with VRAM Functions", p. 96, middle column, line 29-p. 98, left column, line 34; FIGS. 1,2; table 1, _Electronic Design_, vol. 37, No. 24, Nov. 23, 1989, Hasbrouck Heights, N.J., pp. 95-99.
Donald T. Wong et al., "An 11-ns 8K×18 CMOS Static RAM with 0.5-μm Devices", FIG. 8, _IEEE Journal of Solid-State Circuits_, vol. 23, No. 5, Oct. 1988, N.Y., pp. 1095-1103.

Primary Examiner—Eugene R. LaRoche
Assistant Examiner—Son Dinh
Attorney, Agent, or Firm—Foley & Lardner

[57] ABSTRACT

A semiconductor memory device comprises a memory cell array, a row decoder, a column decoder, registers and a control unit. The control unit allows the write operational mode of the column decoder to switch. In the ordinary write operational mode, data in the n registers are written into the active memory cells of the n memory cell columns in on column block selected by the column decoder, respectively. In the block write mode, data in the n registers are written into active memory cells of the n memory cell columns in the $2^N$ column blocks selected by the column decoder, respectively. Another semiconductor memory device comprises N memory units. Each memory unit comprises a memory cell array, a row decoder, a first column decoder, a second column decoder, a data input terminal, registers and a control circuit. The control circuit is operative to allow the operational mode. When the device is in the ordinary mode, data latched in the register is written into one memory cell connected to one word line selected by the row decoder of one column selected by the first column decoder of column blocks selected by the second decoder. While when the device is in the block write mode, data latched in the register is written at the same time into j memory cells connected to one word line selected by the row decoder of column blocks selected by the second column decoder.

15 Claims, 8 Drawing Sheets

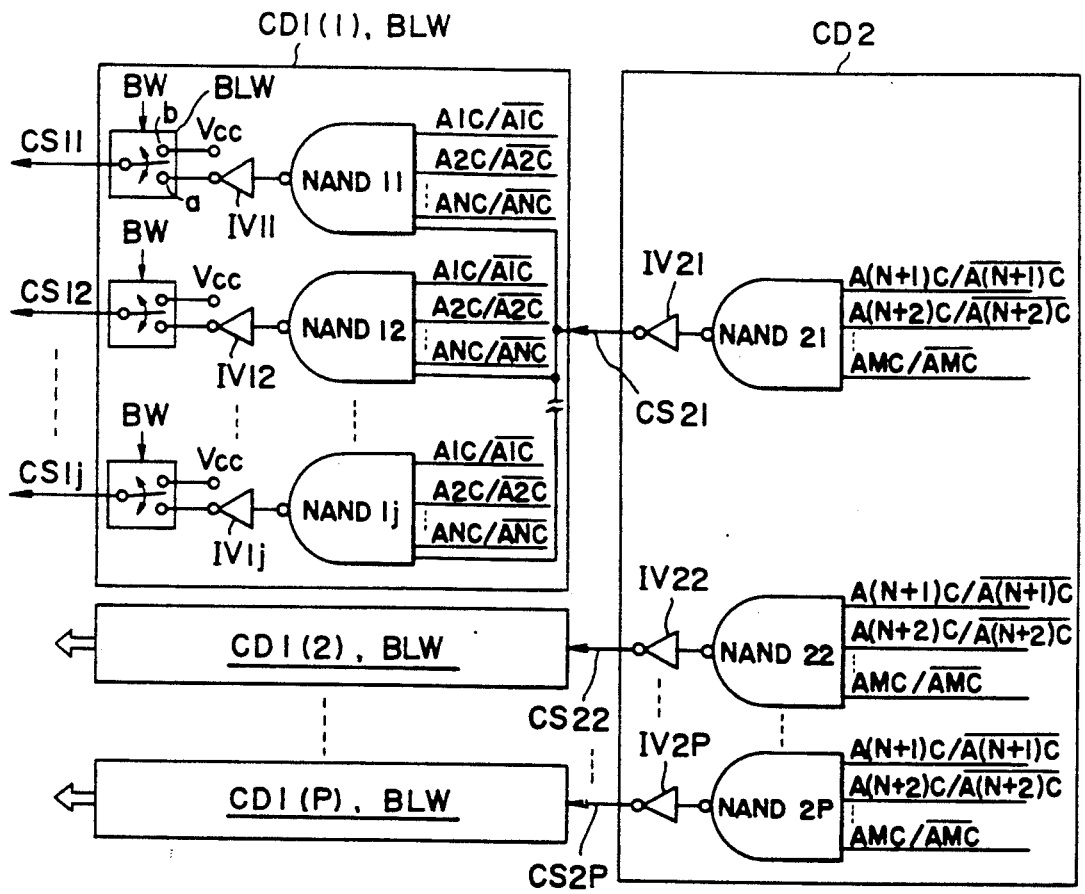
FIG. 5
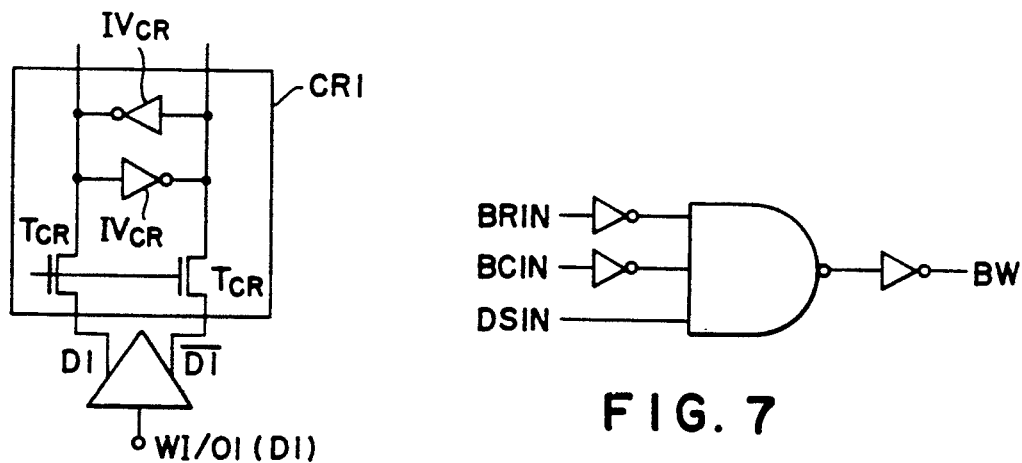
FIG. 6
FIG. 7

SEMICONDUCTOR MEMORY DEVICE

FIELD OF THE INVENTION

This invention relates to a semiconductor memory device, and more particularly to a semiconductor memory device suitable when used as a memory for image data for which data rewriting at a high speed is required.

BACKGROUND OF THE INVENTION

FIG. 1 is a block diagram showing the outline of the configuration of a conventional semiconductor memory device. As seen from FIG. 1, in this semiconductor memory device, an address $A_R/\overline{A_r}(=A_{1R}/A_{1R} \sim A_{XR}/\overline{A_{XR}})$ is inputted to a row decoder RD. The row decoder RD selects one of word lines $WL_1$ to $WL_s$ ($S=2^x$). Further, a single column decoder CD2 to which addresses $A_{(N+1)C}$ to $A_{MC}$ are inputted selects one of P ($=2^{M-N}$) column decoders CD1, CD1, .... Addresses $A_{1C}/\overline{A_{1C}}$ to $A_{NC}/\overline{A_{NC}}$ are inputted to respective column decoders CD1. Each column decoder CD1 selects one of $2^N$ column blocks CB in the main section MP. Each column block CB includes n columns C. n data can be inputted to the column block CB and outputted therefrom at the same time. Each column block has so called a column specification of x n bits and $2^N$ columns. In each column block CB, the memory cell MC is composed of s N-channel MOS transistors $Q_1$, $Q_2$, ..., and s N-channel MOS capacitors C1, C2, ... connected to the respective transistors. These transistors are connected to one of respective bit line pairs BL and NBL and respective word lines WL. n-pairs of bit lines BL1, NBL1; BL2, NBL2; ... are connected to n sense amplifiers SA1, SA2, ..., respectively. n sense amplifiers SA1, SA2, ... are connected to n pairs of input lines I 01, NI 01; I 02, NI 02; ... through n pairs of N-channel MOS transistors Qp1, Qp2, ..., Qn1, Qn2, ..., respectively. n-pairs of input lines I 01, NI 01; I 02, NI 02; ... are connected to n input drivers ID1, ID2, .., and n data D1, D2, ... are inputted from the respective drivers. On the other hand, column decoders CD1 for control are connected in parallel with the gates of n pairs of transistors, i.e., e.g., the gates of transistors Qp1 and Qn1, the gates of transistors Qp2 and Qn2, the gates of transistors Qp3 and Qn3, the gates of transistors Qp4 and Qn4, and the like, respectively. Namely, n columns in one column block CB are simultaneously selected by an output from the decoder CD1.

WI/01, WI/02, ... denote input/output pins, respectively.

In the above-mentioned device, writing of data into the memory cell is carried out as follows. Namely, n data D1, D2, ... are delivered to n input drivers IOD1, IOD2, ..., respectively. Further, column addresses $A_{1C}/\overline{A_{1C}}$ to $A_{NC}/\overline{A_{NC}}$ are delivered to the respective column decoders CD1. In addition, column addresses $A_{(N+1)C}/\overline{A_{1C}}$ to $A_{NC}/\overline{A_{NC}}$ are delivered to the column decoder CD2. Thus, it is possible to write, one by one, n data D1, D2, ... into respective n columns by the single access. Namely, n write data D1, D2, ... are delivered to n pairs of input lines I/01, NI/01; I/02, NI/02; ... through n input buffers (input drivers) IOD1, IOD2, .... These data are delivered to one of n pairs of bit lines BL1, NBL1; BL2, NBL2; ... through n sense amplifiers SA1, SA2, ... from one of n pairs of transistors Qp1, Qn1; Qp2, Qn2; ... each functioning as a transfer gate. As a result, n data D1, D2, ... are simultaneously written, one by one, into n capacitors (cells) C1, C2, ... through n transistors $Q_1$, $Q_2$, ... by the single access.

In the case of using the semiconductor memory device as constructed above as an image memory, there are many instances where a high speed write cycle using an ordinary write cycle, or a page mode, etc. is used in reading data into the memory. In this case, the number of data which can be written by the single access is n which is the same as the number of input drivers IOD1, IOD2, ...

Since the conventional semiconductor memory device is constructed as above, it has drawbacks as described below. Namely, only an extremely small quantity of data can be written by a single access. For this reason, the conventional semiconductor memory device is not suitable for use as an image memory. Namely, since the quantity of write data is small, and the processing speed is low in the case of the above-mentioned conventional memory device even if an attempt is made to satisfy various processing, e.g., painting-out function or color display function, etc., it is difficult to cope with such a requirement.

SUMMARY OF THE INVENTION

With the above in view, this invention has been made, and its object is to provide a semiconductor memory device which can write a large quantity of data thereinto by a single access.

A semiconductor memory device of this invention comprises a memory cell array including a plurality of memory cells arranged in a matrix manner. Each memory cell is connected to one word line and one bit line. Each word line allows a memory cell connected thereto to be active. One bit line carries out input/output of data with respect to one of the active memory cells. The memory cells are divided into $2^N$ (N: a positive integer more than 1) column blocks (CB) every n (n: a positive integer more than 1) columns. The semiconductor memory device further comprises a row decoder responsive to a row address inputted thereto to select one of the word lines, a column decoder responsive to column addresses to select one of column blocks to connect bit lines of memory cells of n columns in the selected column blocks to n data input lines/data readout lines, respectively. The semiconductor memory device further comprises registers which can memorize one bit data applied to input terminals of respective data input lines, provided in the middle of the respective data input lines, and a control unit for allowing a write operational mode of the column decoder to switch between an ordinary write mode and a block write mode in dependency upon level "1" or "0" of a control signal. In the ordinary write operational mode, each column decoder decodes a column address to select only one column block to connect n bit lines in the selected column block to n data input lines, respectively. In the block write mode, each column decoder selects all the $2^N$ column blocks to connect n bit lines in the column blocks to n data input lines, respectively. Thus, in the above-mentioned ordinary write operational mode, data in the n registers are written into active memory cells in the n memory cell columns in one column block selected by the column decoder. In the above-mentioned block write mode, data in the n registers are written into active memory cells in the n memory cell columns of in the respective $2^N$ column blocks selected by the column decoder.

Further, a semiconductor memory device of this invention comprises n memory units adapted so that one bit data is applied thereto, the one bit being written into one or a plurality of memory cells, each of the memory units comprising: a memory cell array including a plurality of memory cells arranged in a matrix form, the memory cells being connected to one word lines and one bit lines, respectively, the respective word lines being adapted to allow memory cells connected thereto to be active, one bit line being adapted to carry out input/output of data with respect to one of active memory cells, the memory cells being divided into P ($P=2^{M-N}$) column blocks, the respective column blocks each including j ($j=2^N$) columns; a row decoder responsive to a row address inputted thereto to select one of the word lines; a first column decoder responsive to column addresses applied thereto to decode the addresses to output one of first column select signals; a second column decoder responsive to column addresses inputted thereto to decode the addresses to output one of second column select signals, thus to select one of the column blocks, the second column decoder being operative to connect bit lines of all columns in the selected one column block to one data lines, respectively; a data input terminal adapted so that one bit write data is applied thereto; registers for latching write data applied to the data input terminal; and a control circuit for connecting the registers to the respective data lines, the control circuit being operative to respond to a mode switching signal applied thereto to allow the operational mode to switch between an ordinary mode and a block write mode, wherein when the device is in the ordinary mode, the control circuit responds to one of first column select signals from the first column decoder to connect one of the data lines to the registers, while when the device is in the block write mode, the control circuit is operative to connect all data lines to the registers irrespective of the second column select signals, whereby when the device is in the ordinary mode, data latched in the register is written into one memory cell connected to one word line selected by the row decoder of one column selected by the first column decoder of column blocks selected by the second decoder, while when the device is in the block write mode, data latched in the register is written at the same time into j memory cells (MC) connected to one word line selected by the row decoder of column blocks selected by the second column decoder.

BRIEF DESCRIPTION OF THE DRAWINGS

In the accompanying drawings:

FIGS. 5 and 6 are circuit diagram showing an embodiment of respective blocks of FIG. 2, respectively;

FIG. 7 is a circuit diagram showing an example of a circuit for generating a signal BW;

DESCRIPTION OF THE PREFERRED EMBODIMENTS

An embodiment of this invention will now be described with reference to the attached drawings.

Figure 1:
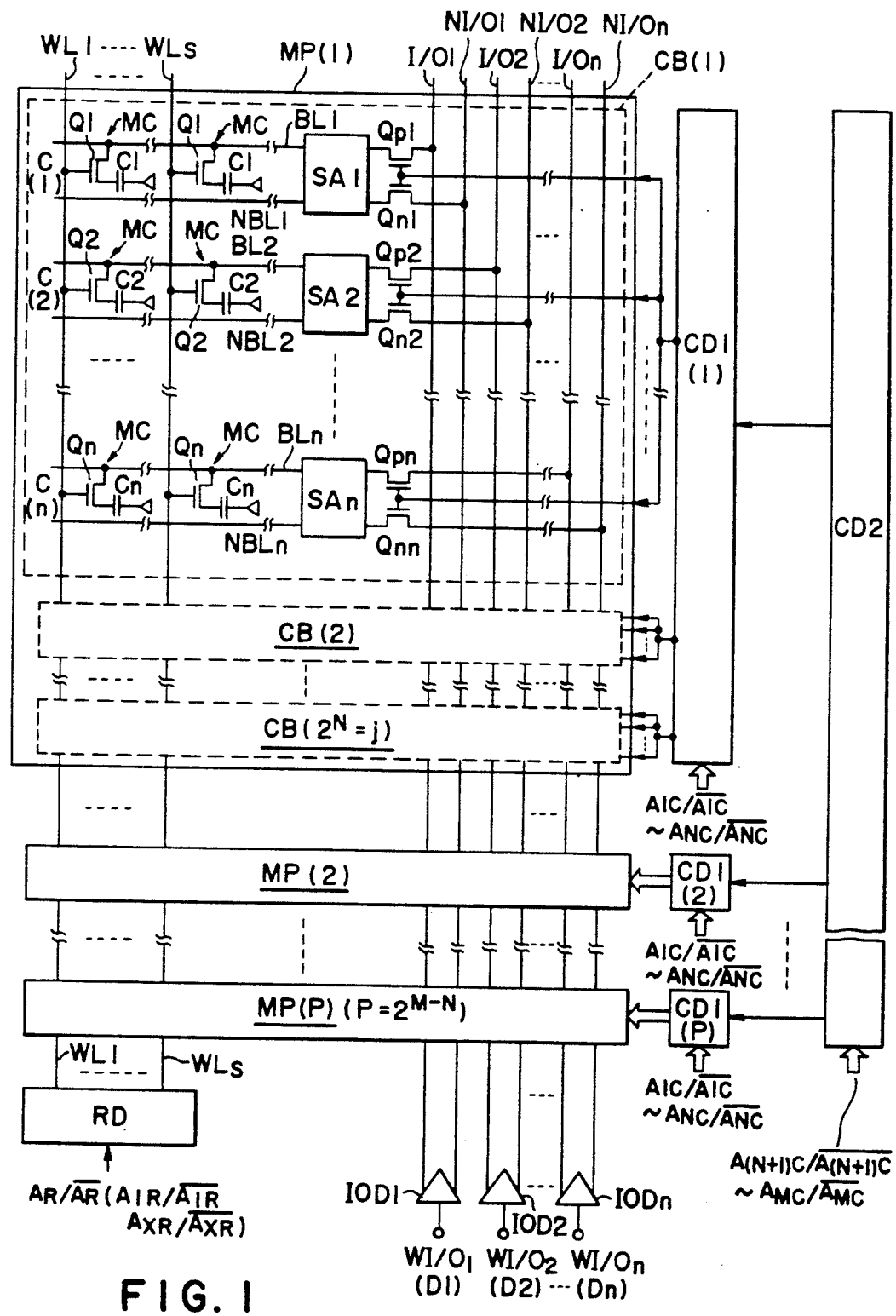
FIG. 1 is a block diagram showing the outline of the configuration of a conventional semiconductor memory device.
Figure 2:
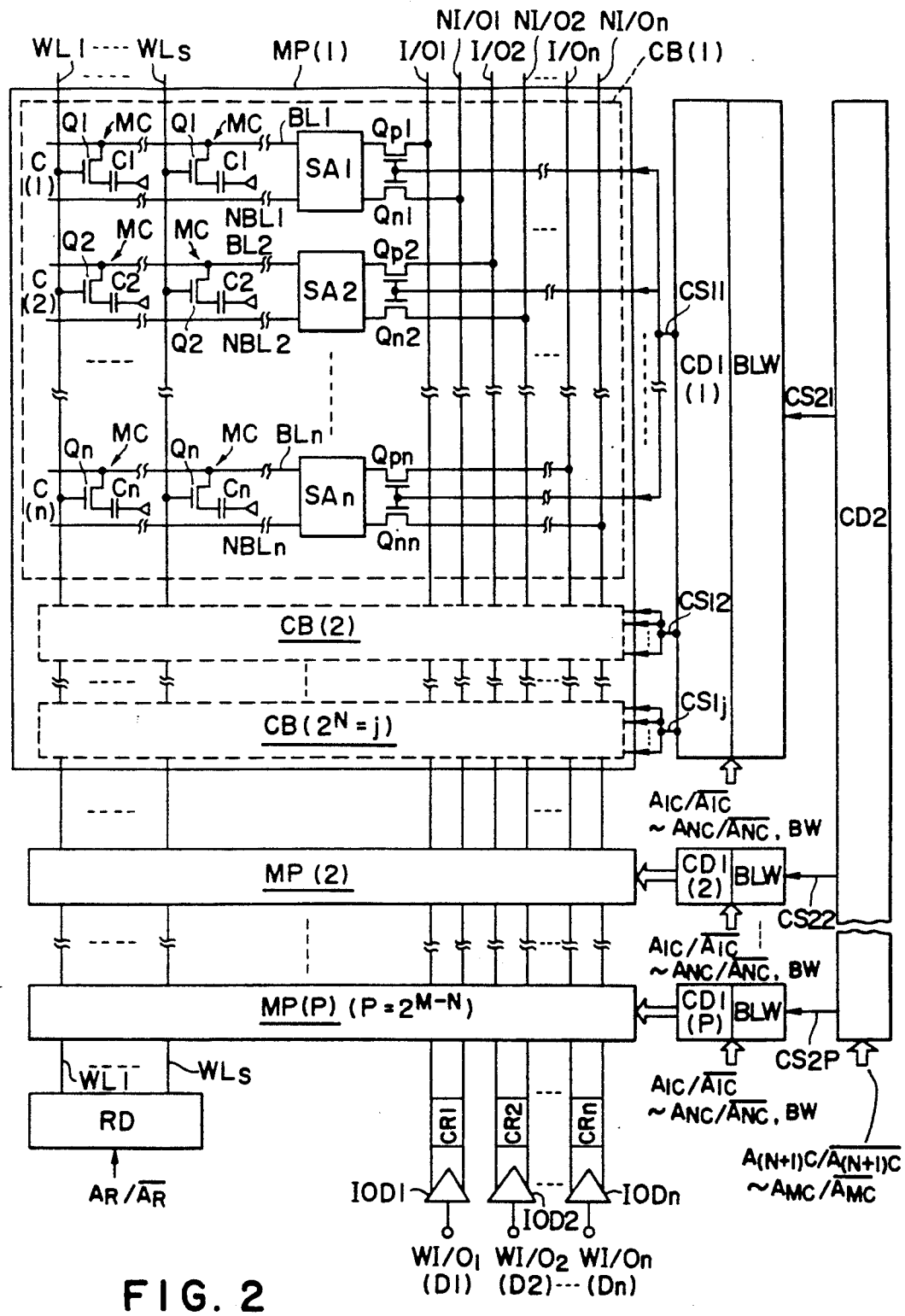
FIG. 2 is a block diagram showing the outline of the configuration of a semiconductor memory device according to a general embodiment of this invention.

FIG. 2 is a block diagram showing the outline of the configuration of a semiconductor memory device according to an embodiment of this invention. In FIG. 2, reference numerals identical to those of FIG. 1 are attached to components equivalent to those of FIG. 1, respectively. The embodiment of FIG. 2 differs form the embodiment of FIG. 1 in that a control unit BLW is provided between decoders CD1 and CD2, and that color registers CR1 to CRn of 1 bit for storing "1" or "0" data are provided in association with the input lien pairs. More particularly, input lines I/01 to I/0n and NI/01 to NI/0n are connected to input drivers I-D1 to I0Dn through color registers CR1 to CRn. Data D1, D2, . . . are inputted from the drivers I-D1 to I-Dn to the input lines I/01 to I/0n and NI/01 to NI/0n. Between column decoders CD1 and CD2, there is provided a control unit BLW for carrying out a control to switch between the first mode (ordinary mode) for carrying out decoding of $\frac{1}{2}^N$ ($2^N=j$) by addresses $A_{1C}/\overline{A_{1C}}$ to $A_{NC}/\overline{A_{NC}}$ to select one of column blocks CB and the second mode (block write mode) for permitting selection of the $2^N$ entire column blocks CB at the same time with the addresses $A_{1C}/\overline{A_{1C}}$ to $A_{NC}/\overline{A_{NC}}$ being neglected. This switching is carried out by a block write switching signal BW of 1 bit, for example.

In the device constructed above, the decoder CD2 selects one of decoders CD1. When the ordinary mode is selected by a signal BW, this device operates in a manner similar to that of FIG. 1. In contrast, when the block write mode is selected, a selected decoder DC1 selects all the column blocks (CB(l) to CB(j) connected thereto. Data D1 to Dn in the color registers CR1 to CRn are written, one by one, into one memory cell MC selected by one work line in each of n columns in the respective $2^N$ column blocks. Namely, writing into n×j memory cells is carried out.

Detailed examples of the circuit CD2, BLW, CD1 and CR1 to CRn of FIG. 2 are shown in FIGS. 5 and 6.

As seen from FIG. 5, the column decoder CD2 includes P NAND circuits NAND 12 to NAND 2P. Addresses $A_{(N+1)C}/\overline{A_{(N+1)C}}$ to $A_{MC}$ are applied to the respective NANDs. One of NANDs 21 to 2P outputs one of decode signals CS21 to CS2P through one of inverters IV21 to IV2P. The decoders CD1 and the control units BLW have all the same configuration. Namely, e.g., CD1(1), BLW include j NAND circuit NAND 11 to NAND 1j as seen from FIG. 5. Addresses $A_{1C}/\overline{A_{1C}}$ to $A_{NC}\overline{A_{NC}}$ and a decode signal CS21 are applied to the respective NANDs. An output form the NAND 11 is applied to one input terminal of the control unit BLW through the inverter IV11. A power supply voltage $V_{CC}$ is applied to the other input terminal of the control unit BLW. The control unit BLW functions as a switch. Namely, when the control signal BW is at "0"

level, the control unit BLW switches to the a terminal side to provide an output from the inverter IV11 as the decode signal CS11. In contrast, when the control signal BW is at "1" level, the control unit BLW switches to the b terminal side to output the power supply voltage $V_{CC}$ as the signal CS11. Other NANDs, inverters, and the control units are constructed in the same manner as stated above.

Further, other decoders CD1(2) to (P), and the control unit BLW are constructed in the same manner as the above-described decoder CD1(1) and the control unit BLW.

Color registers CR1 to CRn have all the same configuration. For example, color register CR1 is shown in FIG. 6. Namely, this register includes transfer gates $T_{CR}$ connected in series with complementary data lines, respectively, and a pair of inverters $IV_{CR}$ inversely connected in parallel between complementary data lines. If a procedure is taken to apply data D1 to the terminal WI/01 under the state where a pair of transfer gates $T_{CR}$ are caused to be turned ON thereafter to allow the pair of gates $T_{CR}$ to be turned off, data applied earlier is registered into the color register CR1.

Figure 3:
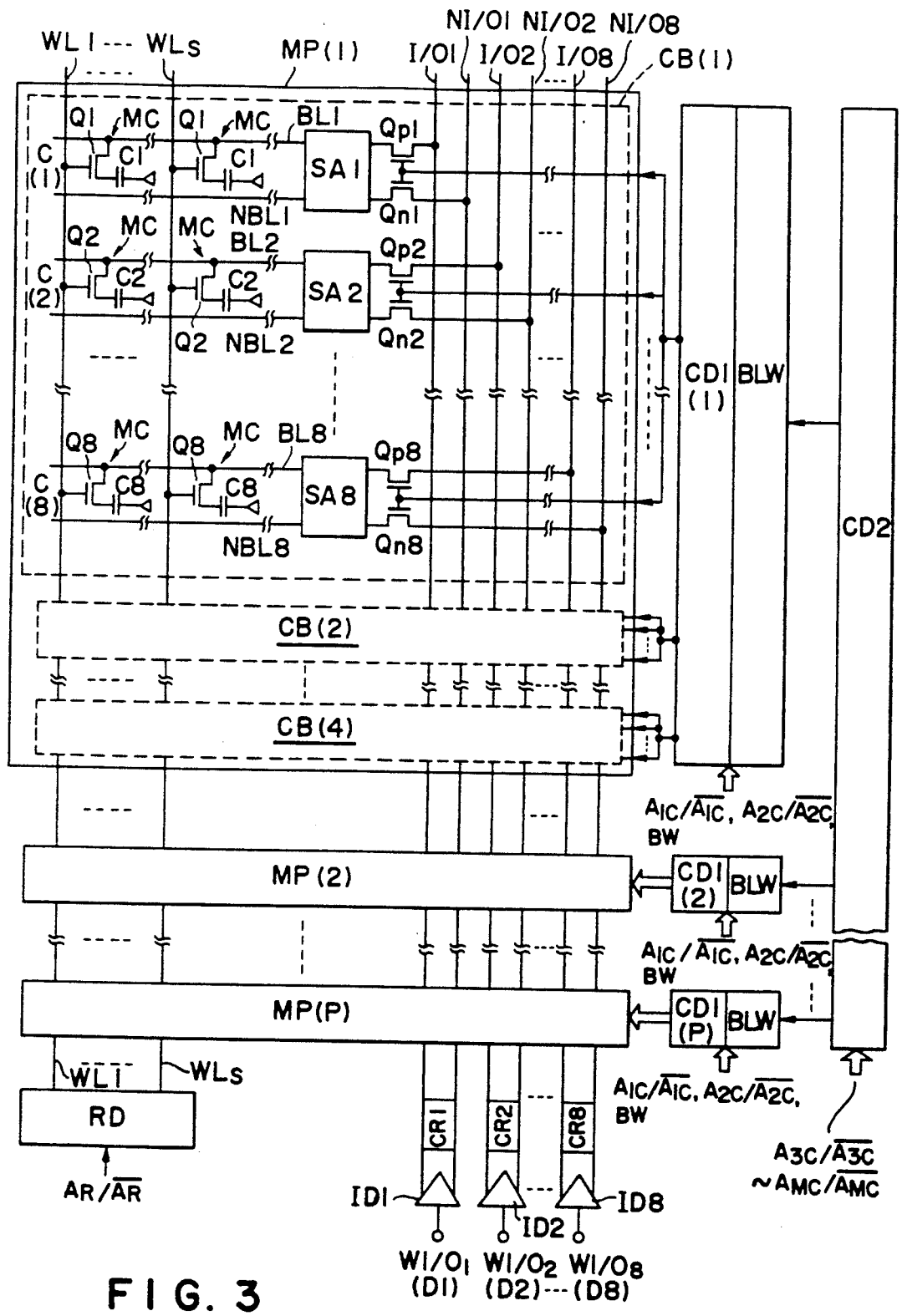
FIG. 3 is a block diagram showing the outline of the configuration of a semiconductor memory device according to an actual embodiment of this invention.

FIG. 3 shows an example of so called × 8 bits and 4 columns wherein, in the device of FIG. 2, N is set to 2, i.e., the number of column blocks CB is set to four, and n is set to 8, i.e., data simultaneously inputted/outputted have D1 to D8 of 8 bits.

The operation of the device of FIG. 3 will now be described.

The decoder CD2 selects one of decoders CD1.

In the ordinary mode, column addresses $A_{1C}$ and $A_{2C}$ are decoded by a selected decoder CD1. Thus, one of four column blocks CB is selected.

On the other hand, in the block write mode, a block write switching signal BW is delivered to the control unit BLW. Thus, decoding of column addresses $A_{1C}/\overline{A_{1c}}$, $A_{2C}/\overline{A_{2c}}$ by the column decoder CD1 is neglected. Four column blocks CB are selected at the same time. In this case, as data subjected to block write, data stored and set in advance into the color registers CR1 to CR8 are used in place of data D1 to D8 inputted to the input drivers I0D1 to I0D8 in the block write cycle.

Figure 4:
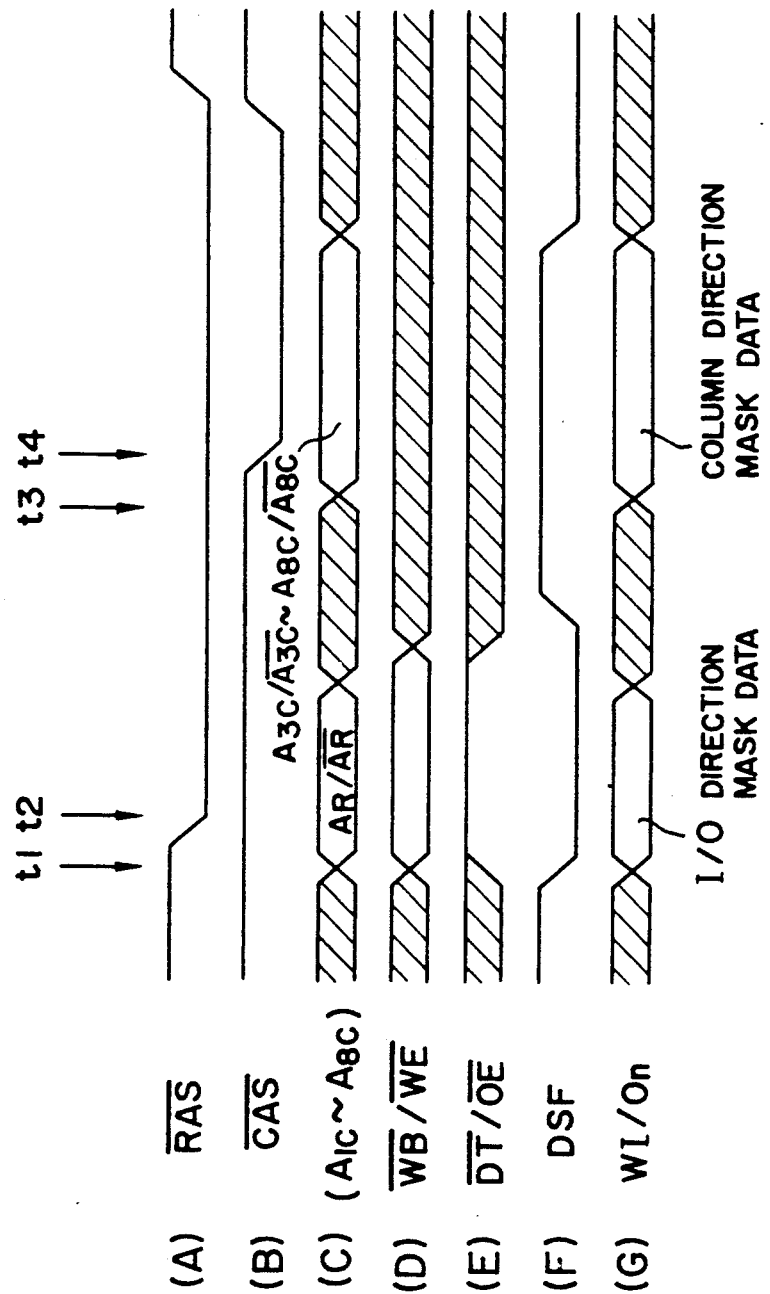
FIG. 4 is a timing chart for explaining the operation of the configuration of FIG. 3.

The timings of this block write is shown in FIG. 4. Namely, at timing t2, a row address (C) and a mask data (G) are established. In this instance, when the column address strobe CAS (B) is at H level, DT/OE (E) is at H level, and DSF (F) is at L level, the operational mode enters the block write mode.

Alternatively, at timing t4, column addresses $A_{3C}/\overline{A_{3c}}$ to $A_{8C}/\overline{A_{8c}}$ (C) and a column select (G) are established. In this instance, when DSF (F) is at H level, the block write operation is executed. In this connection, the column address input at the time of fall (t4) of the column address strobe $\overline{CAS}$ (B) is $A_{3C}/\overline{A_{3c}}$ to $A_{8C}/\overline{A_{8c}}$ inputted to the column decoder CD2. The addresses $A_{1C}$ and $A_{2C}$ inputted to the column decoder CD1 become ineffective address data.

When this device is in a block write mode, it is permitted to have a mask function. As shown in the timing chart of FIG. 4, ON/OFF operation of the mask function in the I/O direction is carried out by a level of $\overline{WB}/\overline{WE}$ (D) at the time of fall of the row address strobe $\overline{RAS}$ (A) at timing t2. Namely, when $\overline{WB}/\overline{WE}$ (D) is at L level, the mask function in the I/O direction becomes effective or valid. By levels of input data D1 to D8 at this time, masking in the I/O direction is carried out. Namely, when data D1 to D8 are at H level, masking in the I/O direction is not effective. When data D1 to D8 are at L level, making in the I/O direction is enabled. Further, masking in the column direction is carried out by data D1 to D4 (G) when the column address strobe $\overline{CAS}$ (A) falls at time t4.

Tables 1 and 2 show examples of mask functions in the I/O and column directions at the time of block write. As shown in Table 1, where input data D1 to D8 are "01100111", masking is applied to data corresponding to input data D1, D4 and D5 as shown in Table 2. On the other hand, where column block select data selected by input data D1 to D4 are "1101", masking is applied to the column 3 as shown in Table 2. As a result, where "00110101" is written in advance into color registers CR1 to CR8 through input drivers I0D1 to I0D8, the contents of the color registers CR1 to CR8 are written into bits and columns which are not subjected to masking as shown in Table 2.

Table 2 shows the following fact in relation to FIG. 2. Namely, it is now assumed that the decoder DC2 selects the decoder DC(1), and that the control unit BLW selects the block write mode. At the time when the mask function is inoperative, data "00110101" (see Table 1) stored in advance into the color registers CR1 to CR8 are written into four column blocks CB(1) to CB(4), respectively. Namely, when attention is drawn to, e.g., column block CB(1), data of "0", "0", "1", "1", "0", "1", "0", "1" are written, one by one, into memory cells MC belonging to the columns C(1) to C(8) of memory cells MC selected by a word line WL1, respectively. This is the same in connection with respective columns C(1) to C(8) of column blocks CB(2) to CB(4). On the contrary, where the mask function is caused to be operative, so the result is as shown in Table 2, data write operation will be conducted as follows. Namely, writing into any columns C(1) to C(8) in the column block CB(3) is not carried out. Namely, data remain in respective original states. In the column blocks CB(1), CB(2) and CB(4), writing into the columns C(1), C(4) and C(5) is not carried out. Thus, when attention is drawn to, e.g., the column block CB(1), data of "0", "1", "1", "0", "1" in the color registers CR2, CR3, CR6, CR7 and CR8 are written into memory cells belonging to columns C(2), C(3), C(6), C(7) and C(8). In contrast, writing into memory cells belonging to other columns C(1), C(4) and C(5) is not carried out.

TABLE 1

| INPUT DATA | MASK DATA | COLUMN BLOCK SELECT DATA | CONTENTS OF COLOR REGISTERS CR1 TO CR8 |
| --- | --- | --- | --- |
| D1 | 0 | 1 | 0 |
| D2 | 1 | 1 | 0 |
| D3 | 1 | 0 | 1 |
| D4 | 0 | 1 | 1 |
| D5 | 0 |   | 0 |
| D6 | 1 |   | 1 |
| D7 | 1 |   | 0 |
| D8 | 1 |   | 1 |

TABLE 2

| COLUMN | COLUMN BLOCK CB(1) | COLUMN BLOCK CB(2) | COLUMN BLOCK CB(3) | COLUMN BLOCK CB(4) |
| --- | --- | --- | --- | --- |
| C(1) | MASK | MASK | MASK | MASK |
| C(2) | 0 | 0 | MASK | 0 |
| C(3) | 1 | 1 | MASK | 1 |
| C(4) | MASK | MASK | MASK | MASK |

TABLE 2-continued

| COLUMN | COLUMN BLOCK CB(1) | COLUMN BLOCK CB(2) | COLUMN BLOCK CB(3) | COLUMN BLOCK CB(4) |
|---|---|---|---|---|
| C(5) | MASK | MASK | MASK | MASK |
| C(6) | 1 | 1 | MASK | 1 |
| C(7) | 0 | 0 | MASK | 0 |
| C(8) | 1 | 1 | MASK | 1 |

The above-mentioned control signal BW is generated by a circuit shown in FIG. 7, for example. In the figure, signals BRIN, BCIN and DSIN applied to NANDs are signals synchronous with the rising and falling of the signals $\overline{RAS}$, $\overline{CAS}$ and $\overline{DSF}$, respectively.

Figure 8:
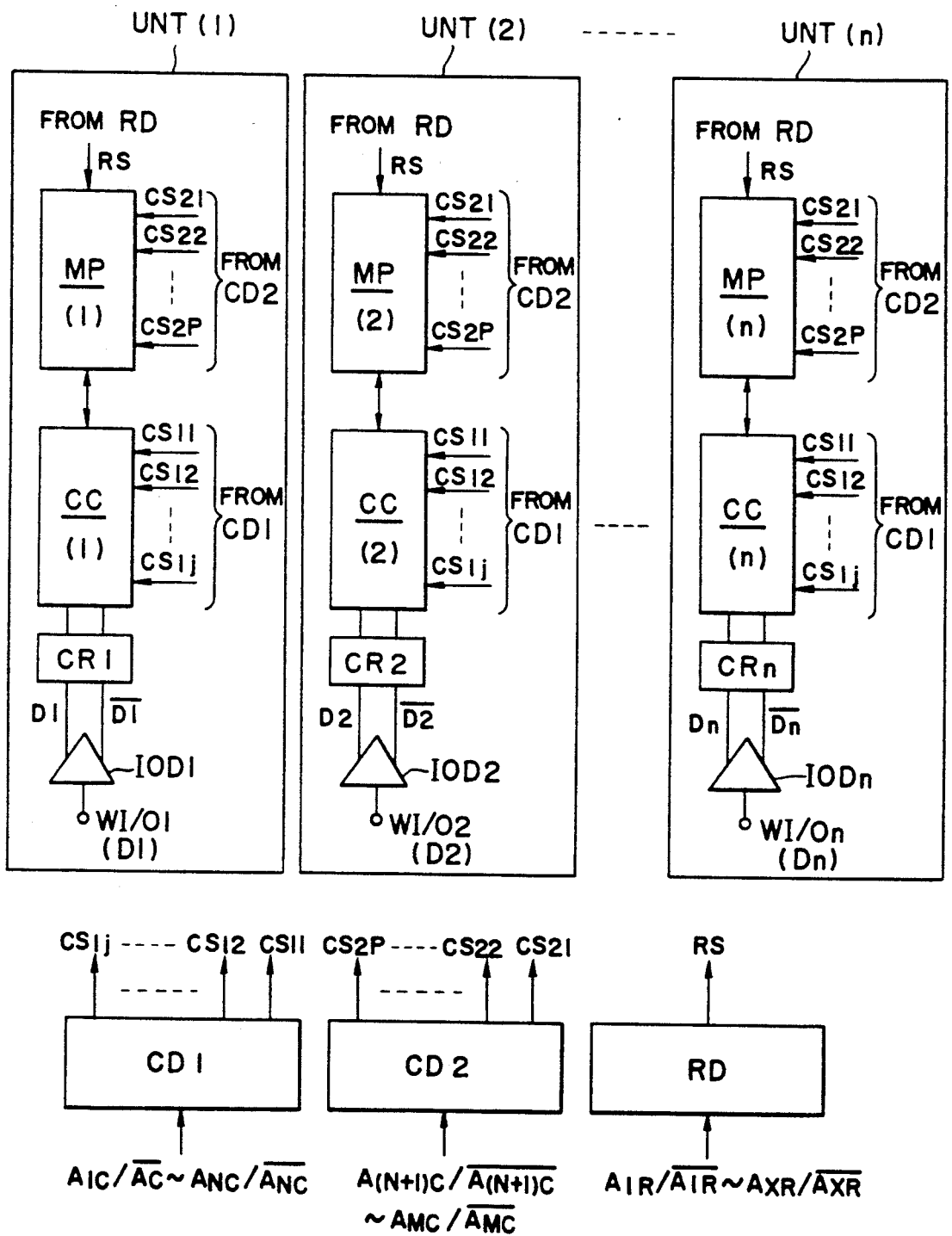
FIG. 8 is a block diagram showing the outline of the configuration according to another embodiment of this invention.

FIG. 8 is a block diagram showing the entire configuration of a different embodiment according to this invention.

The circuits of respective bits have all the same configuration. The first bit (WI/01) section (first memory unit UNIT(1)) will be chiefly described. Addresses $A_{(N+1)C}/\overline{A_{(N+1)C}}$ to $A_{MC}/\overline{A_{MC}}$ are inputted to the second column decoder CD2. As a result, one of decode signals CS21 to CS2P is outputted as a decode signal. The decode signal thus obtained is applied to the memory unit MP(1). A column control circuit CC(1) is connected to the memory unit MP(1). One of decode signals CS11 to CS1j from the first column decoder CD1 is applied to the circuit CC(1). Namely, the decoder CD1 responds to addresses to $A_{1c}/\overline{A_{1c}}$ to $A_{NC}/\overline{A_{NC}}$ applied thereto to decode them to output one of decode signals CS11 to CS1j. An input/output pin WI/01 is connected to the control circuit CC(1) through the color register CR1 and the driver I0D1. Other memory units UNIT(2) to (UNIT(n)) are similar to the above.

Figure 9:
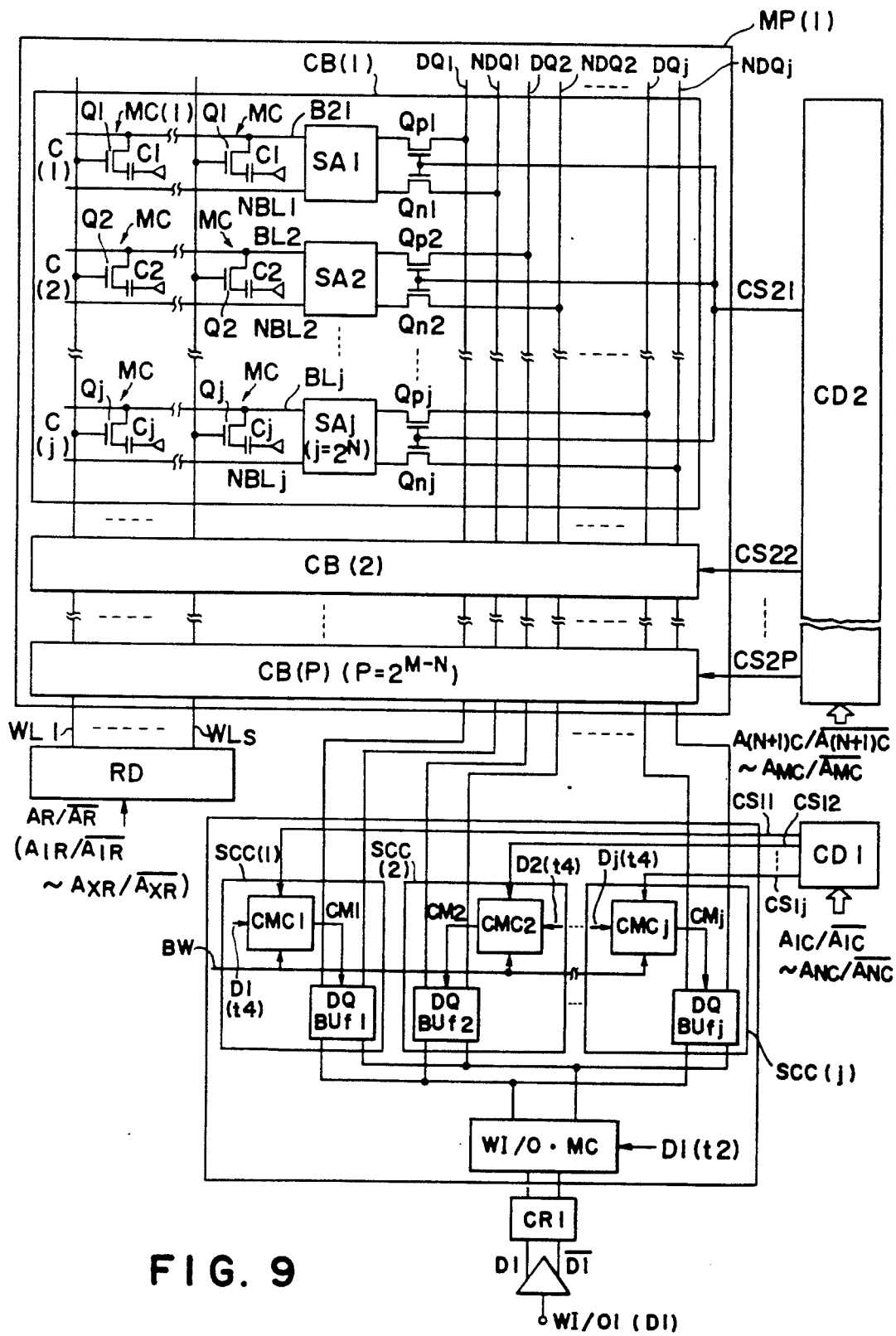
FIG. 9 is a circuit diagram of an embodiment of a portion of the circuit shown in FIG. 8.

A portion of the circuit of FIG. 8 is shown in FIG. 9 in a more practical manner. Namely, FIG. 9 shows the detail of the portion of the first unit UNIT(1). Further, the control circuit CC includes j subcontrol circuits SCC corresponding to the number j of columns in the respective column blocks CB, and one WI/0 mask control WI/O·MC. Each subcontrol circuit SCC includes a switching circuit CMC and a DQ buffer DQ Buf.

Figure 10:
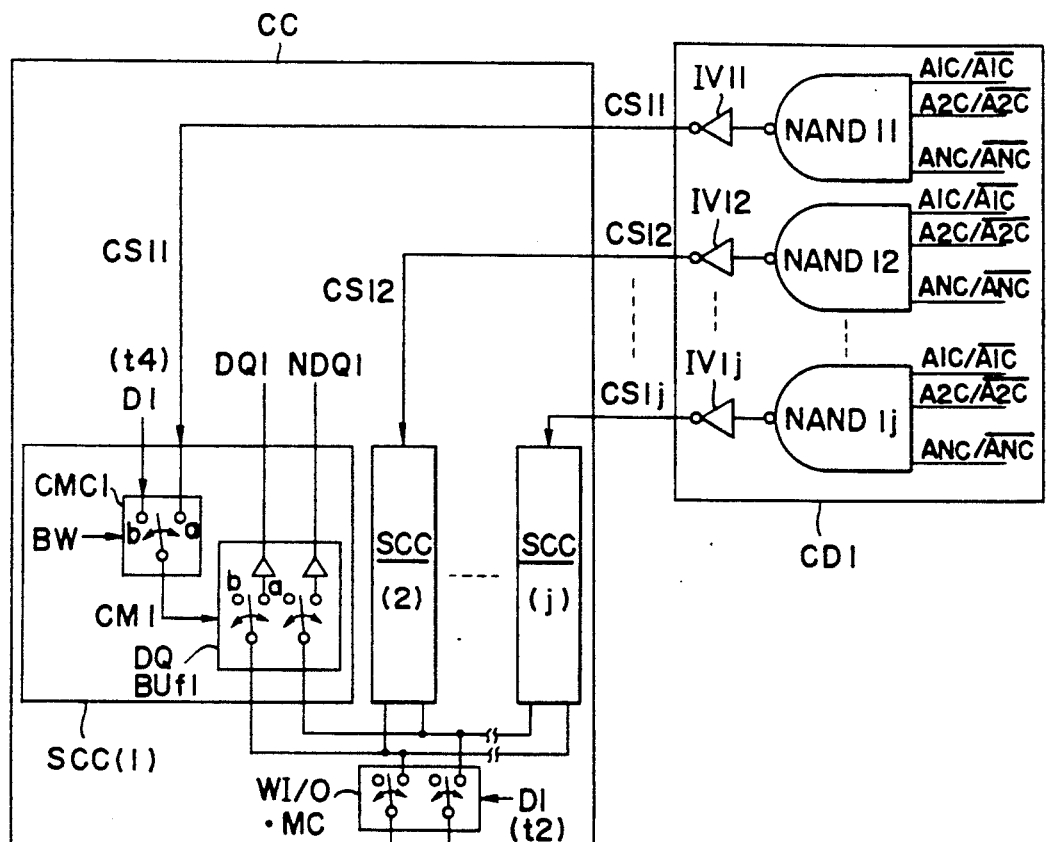
FIG. 10 is a circuit diagram showing an embodiment of respective blocks of FIG. 9.

The details of the first column decoder CD1, the control circuit CC and the color register CR1 are shown in FIG. 10.

The decoder CD1 includes j NAND circuits NAND 11 to 1j. Addresses $A_{1C}$ to $A_{NC}$ or $\overline{A_{1C}}$ to $\overline{A_{NC}}$ are applied to respective NANDs. Each output is connected to the control circuit CC through one of inverters IV11 to IV1j.

A decode signal CS11 from the decoder CD1(1) and input data D1 to the input/output pin WI/01 are inputted in parallel to the switching circuit CMC1 in respective subcontrol circuits SCC in the control circuit CC. This switching circuit CMC1 switches between the signals CS11 and D1 to output it as an output CM1 in dependency upon the level "1" or "0" of the control signal. This output CM1 is applied to the DQ buffer DQ Buf 1. In dependency upon the level "1" or "0" of CM1, the buffer DQ Buf 1 is placed in the states where the input is connected to the output and is cut off therefrom, respectively.

The color register CR1 has the same configuration as that of the color register shown in FIG. 6. Namely, this register includes transfer gates $T_{CR}$ respectively connected in series with complementary data lines, and a pair of inverters $IV_{CR}$ inversely connected in parallel between complementary data lines.

Figure 11:
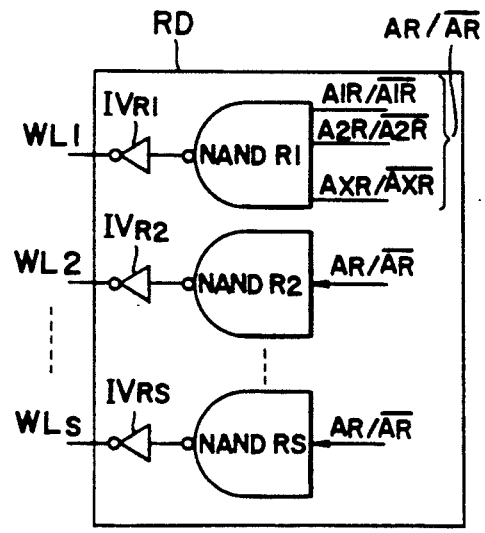
FIG. 11 is a circuit diagram showing an example of the row decoder.

Further, the row decoder RD is constructed as shown in FIG. 11, for example.

The device of FIGS. 8 to 10 operates in a manner similar to the devices which has been described with reference to FIGS. 2 to 7. Namely, this device has the same operational mode (the ordinary operational mode and the block write mode), and are permitted to have column direction mask and/or I/O direction mask in the block write mode, respectively.

The ordinary operational mode will be first described.

When the device is in this mode, one memory cells MC are selected every respective WI/O by the decoders RD, CD1 and CD2. Data stored in advance in the color registers CR1 to CRn are written into the selected one memory cells MC, respectively.

Namely, when attention is drawn to the first bit, as seen from FIG. 9, the row decoder RD selects one of word lines WL1 to WLS. It is now assumed that the word line WL1 is selected. Further, the column decoder CD2 outputs one of decode signals CS21 to CS2P. It is assumed that this decoder outputs, e.g., a decode signal CS21 to allow j columns C(1) to C(j) in the memory block CB(1) to be active. The column decoder CD1 outputs one of decode signals CS11 to CS1j. It is assumed that, e.g., a decode signal CS11 is outputted. That signal CS11 is applied to the switching circuit CMC1. As seen from FIG. 10, a control signal BW is also applied to this circuit CMC1. When the device is in the ordinary operational mode, this signal BW is at "0" level. For this reason, the level "1" of the input signal CS11 is applied to the buffer DQ Buf 1 as an output CM1. Thus, the buffer DQ Buf 1 is switched to ON state (a terminal side). On the other hand, the WI/O mask control W/IO·MC is switched to ON state (non-masking state) by the "1" level signal of data D1 (t2) applied to the pin WI/01 at time t2 of FIG. 4. Thus, data D1 stored in advance into the color register CR1 is written into the memory cell MC(1).

The block write mode will now be described.

In the case of this mode, when attention is drawn to the first bit, data stored in advance into, e.g., the color register CR1 is written at the same time into j memory cells in the column block CB(1) of memory cells connected to the word line shown in FIG. 9. Data of the second to the n-th bits are written in a manner similar to the above.

Namely, it is now assumed that row decoder RD selects a word line WL1, that the first column decoder CD2 outputs a signal CS21, and that the second column decoder CD1 outputs a signal CS11. In this mode, the control signal BW is set to "1". For this reason, the switching circuits CMC1 to CMCj are all switched to the D1 side (b terminal side). D1 at time t4 (FIG. 4) is taken in as the D1. In this mode, at time t4, D1 is at "1" level. For this reason, "1" is applied to the buffers DQ Buf 1 to DQ Buf j as the CM1. For this reason, all the buffers DQ Buf 1 to DQ Buf j are brought into ON state. On the other hand, at time t2, D1 is applied to the WI/O mask control WI/O·MC. For this reason, the mask control WI/O·MC is in ON state. For this reason, data D1 stored in advance into the color register CR1 is written into j memory cells connected to the word line WL1 of memory cells in the column block CB(1).

In the above-mentioned block write mode, masking in the I/O direction and masking in the column direction can be applied.

Masking in the I/O direction in the block write mode will be first described.

As seen from FIG. 9, data D1 is applied, as a control signal, to the WI/O mask control WI/O·MC corresponding to the input pin WI/O1. Namely, data $Dn(t_2)$ applied at time $t_2$ is applied, as a control signal, to the pin WI/On of the mask control WI/O·MC corresponding to the n-th bit. When the device is simply in the block write mode, all of n data $D1(t_2)$ to $Dn(t_2)$ are at "1" level at time $t_2$. However, in the case of applying masking in the I/O direction, it is sufficient to allow an arbitrary one of n data $D1(t_2)$ to $Dn(t_2)$ to be "0". In the memory unit MP corresponding to the mask control WI/O·MC to which data $Dn(t_2)$ of "0" is applied, data write operation is not carried out.

The masking in the column direction in the block write mode will be conducted as follows.

Namely, this masking will be described with reference to FIG. 9, for example. It is sufficient to apply data of "0" level, as data $Dj(t_4)$ at time $t_4$, to an arbitrary one of switching circuits CMC1 to CMCj. Thus, e.g., "0" data is applied to the buffer DQ Buf 1. As a result, the buffer DQ Buf 1 is switched to OFF state (FIG. 10). Thus, data in the color register CR1 is not propagated to the data line DQ1 and NDQ1. Thus, even if writing into the memory cells in the columns C(2) to C(j) within, e.g., the column block CB(1) is carried out, writing into the memory cells belonging to the column C(1) is not carried out. Namely, masking in the column direction is applied.

Explanation has been made by drawing attention to only a portion of the circuit for facilitating understanding. However, it is to be noted that write operations in respective modes are carried out in other portions having similar configuration in a manner similar to the above.

The explanation which has been given with reference to FIG. 4 and tables 1 and 2 in connection with the first embodiment (FIGS. 2 and 3) applies to that in connection with the second embodiment (FIG. 8) as it is.

As described above, in accordance with this embodiment, data having a quantity $2^N$ times larger than that of RAM by the single access can be written. If the data quantity is the same, write speed $2^N$ times higher than that of RAM can be realized. For example, with respect to the block write in the case of a four column specification, N is equal to 2. Thus, data quantity $2^2 (=4)$ times larger than in the prior art can be written at a time. Further, the block write is very effective for particularly the processing of painting out of a square area of the image processing. For example, where the I/O direction is caused to be in correspondence with the pixel direction, in the block write of 8 bit configuration and four column specification, data can be simultaneously written into 8×4 pixels. Further, by using the mask function, the processing on the boundary between areas can be very simply implemented at a high speed. In addition, in the case of using I/O as color information, 8 of 8×4 bits and 4 thereof may be used as color information and data in the pixel direction, respectively.

From the foregoing description, in accordance with this invention, same data can be written into respective columns of a plurality of column blocks. Accordingly, the data quantity which can be written by the single access is increased, thus making it possible to write data at a high speed. In addition, a delicate control of write data can be made by the mask function. Accordingly, a semiconductor memory device effective for image storage or image processing is provided.

What is claimed is:

1. A semiconductor memory device comprising:
   a memory cell array including a plurality of memory cells arranged in a matrix form, said memory cells being connected to one word lines and one bit lines, respectively, said respective word lines being adapted to allow memory cells connected thereto to be active, one bit line being adapted to carry out input/output of data with respect to one of active memory cells, said memory cells being divided into $2^N$ (N: a positive integer more than 1) column blocks every n (n: a positive integer more than 1) columns,
   a row decoder responsive to a row address inputted thereto to select one of said word lines,
   a column decoder responsive to column addresses inputted thereto to select one of column blocks, said column decoder being operative to connect bit lines of memory cells of n columns in the selected column blocks to n data input lines/data readout lines, respectively,
   registers provided in the middle of said respective data input lines, said registers being adapted so that one bit data applied to input terminals of said respective data input lines can be stored therein, and
   a control unit for allowing a write operational mode of said column decoder to switch between an ordinary write mode and a block write mode in dependency upon a level of "1" or "0" of a control signal, wherein when said device is in said ordinary write operational mode, said column decoder decodes a column address to select only one column block to connect n bit lines in the selected column block to n data input lines, respectively, while when said device is said block write mode, said column decoder selects all $2^N$ column blocks to connect n bit lines in said column blocks to n data input lines, respectively, and wherein when said device is in said ordinary write operational mode, data in said n registers are written into active memory cells in the n memory cell columns in one column block selected by said column decoder, while when said device is in said block write mode, data in said n registers are written into active memory cells of the n memory cell columns in the $2^N$ column blocks selected by said column decoder, respectively.

2. A device as set forth in claim 1, which further comprises a first mask control circuit operative so that when one of "1" and "0" level data is applied to the input terminals of said respective data input lines, writing from said respective registers into said memory cells is executed, while when the other level data is applied, said writing is not executed.

3. A device as set forth in claim 1, which further comprises a second mask control circuit adapted so that when said device is in said block write operational mode, said device is operative so that selection by said column decoder of a column block corresponding to one of "1" and "0" of input data of an arbitrary number of n input terminals of said input terminals of said data input lines is allowed, and that selection by said column decoder of a column block corresponding to the other thereof is inhibited.

4. A device as set forth in claim 1, which further comprises P column decoders, said $2^N$ column blocks being connected to said column decoders, respectively, one of said P column decoders being selected by a main column decoder, main column addresses being applied to said main column decoder.

5. A semiconductor memory device comprising N memory units adapted so that one bit data is applied thereto, said one bit data being written into one or a plurality of memory cells, each of said memory units comprising:

a memory cell array including a plurality of memory cells arranged in a matrix form, said memory cells being connected to one word lines and one bit lines, respectively, said respective word lines being adapted to allow memory cells connected thereto to be active, one bit line being adapted to carry out input/output of data with respect to one of active memory cells, said memory cells being divided into P column blocks, said respective column blocks each including j columns, a row decoder responsive to a row address inputted thereto to select one of said word lines, a first column decoder responsive to column addresses applied thereto to decode said addresses to output one of first column select signals, a second column decoder responsive to column addresses inputted thereto to decode said addresses to output one of second column select signals, thus to select one of said column blocks, said second column decoder being operative to connect bit lines of all columns in the selected one column block to one data lines, respectively, a data input terminal adapted so that one bit write data is applied thereto, registers for latching write data applied to said data input terminal, a control circuit for connecting said registers to said respective data lines, said control circuit being operative to respond to a mode switching signal applied thereto to allow the operational mode to switch between an ordinary mode and a block write mode, wherein when said device is in said ordinary mode, said control circuit responds to one of first column select signals from said first column decoder to connect one of said data lines to said registers, while when said device is in said block write mode, said control circuit is operative to connect all data lines to said registers irrespective of said second column select signals, whereby when said device is in said ordinary mode, data latched in said register is written into one memory cell connected to one word line selected by said row decoder of one column selected by said first column decoder of column blocks selected by said second decoder, while when said device is in said block write mode, data latched in said register is written at the same time into j memory cells connected to one word line selected by said row decoder of column blocks selected by said second column decoder.

6. A device as set forth in claim 5, wherein said respective control circuits include column direction mask circuits responsive to j column direction mask control signals applied thereto when said device is in said block write mode to selectively cut off connections between said registers and j data lines.

7. A device as set forth in claim 5, wherein said respective control circuits include I/O direction mask circuits responsive to one I/O direction mask control signal applied thereto when said device is in said block write mode to cut off the connection between said registers and all of j data lines.

8. A device as set forth in claim 6, wherein said respective control circuits include I/O direction mask circuits responsive to one I/O direction mask control signal applied thereto when said device is in said block write mode to cut off the connection between said registers and all of j data lines.

9. A device as set forth in claim 5, wherein said respective control circuits include j column direction circuits, said respective mask circuits being connected in series between said respective data lines and said registers, each of said respective mask circuits comprising; a first switch circuit to which one of first column select signals form said first decoder, one of j column direction mask control signals, and said mode switching signals are applied, said first switch circuit being operative to output either one of column select signals or one of column direction mask control signals in dependency upon the level of said mode switching signal; and a second switch circuit to which an output from said first switch circuit is applied, said second switch circuit being operative to carry out ON/OFF operation of connections between said data lines and said registers.

10. A device as set forth in claim 5, wherein said registers include latch circuits comprised of two inverters inversely connected in parallel, and transfer gates, respectively, said transfer gates being operative to carry out ON/OFF operation of connections between said data input terminals and said latch circuits.

11. A device as set forth in claim 5, wherein transfer gates are connected between said respective data lines and said respective bit lines, each of said transfer gates being operative to be conductive when one of second column select signals from said second column decoder is applied thereto.

12. A device as set forth in claim 6, wherein transfer gates are connected between said respective data lines and said respective bit lines, each of said transfer gates being operative to be conductive when one of second column select signals from said second column decoder is applied thereto.

13. A device as set forth in claim 7, wherein transfer gates are connected between said respective data lines and said respective bit lines, each of said transfer gates being operative to be conductive when one of second column select signals from said second column decoder is applied thereto.

14. A device as set forth in claim 8, wherein transfer gates are connected between said respective data lines and said respective bit lines, each of said transfer gates being operative to be conductive when one of second column select signals from said second column decoder is applied thereto.

15. A device as set forth in claim 9, wherein transfer gates are connected between said respective data lines and said respective bit lines, each of said transfer gates being operative to be conductive when one of second column select signals from said second column decoder is applied thereto

* * * * *